United States Patent
Sugawara et al.

(10) Patent No.: US 7,929,152 B2
(45) Date of Patent: Apr. 19, 2011

(54) APPARATUS FOR DETECTING PRESS-BONDED BALL AT BONDING PORTION IN BONDING APPARATUS AND METHOD FOR DETECTING PRESS-BONDED BALL AT BONDING PORTION

(75) Inventors: Kenji Sugawara, Kokubunji (JP); Yong Chen, Fussa (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 370 days.

(21) Appl. No.: 12/074,758

(22) Filed: Mar. 6, 2008

(65) Prior Publication Data
US 2008/0259352 A1 Oct. 23, 2008

(30) Foreign Application Priority Data

Mar. 8, 2007 (JP) ................................ 2007-058643

(51) Int. Cl.
*G01B 11/24* (2006.01)
*G01B 11/14* (2006.01)
(52) U.S. Cl. ...................... 356/601; 356/614; 356/394
(58) Field of Classification Search .......... 356/601–625, 356/389–394; 250/559.34; 382/151, 291, 382/294
See application file for complete search history.

(56) References Cited

U.S. PATENT DOCUMENTS

| 5,030,008 | A | * | 7/1991 | Scott et al. | 356/394 |
| 5,394,246 | A | * | 2/1995 | Sugawara | 356/394 |
| 5,583,641 | A | * | 12/1996 | Tomiyama et al. | 356/625 |
| 5,870,489 | A | * | 2/1999 | Yamazaki et al. | 382/151 |
| 6,516,515 | B2 | * | 2/2003 | Ohkubo et al. | 29/840 |
| 6,917,699 | B2 | * | 7/2005 | Sugawara | 382/151 |
| 6,984,879 | B2 | * | 1/2006 | Kim et al. | 257/676 |
| 7,013,039 | B2 | * | 3/2006 | Sugawara | 382/151 |

FOREIGN PATENT DOCUMENTS

| JP | 07-297220 | 11/1995 |
| JP | 08-031863 | 2/1996 |

* cited by examiner

*Primary Examiner* — Sang Nguyen
(74) *Attorney, Agent, or Firm* — DLA Piper LLP (US)

(57) ABSTRACT

A detecting apparatus used in a bonding apparatus including a capillary and a detection camera disposed with a certain amount of offset from the capillary and capable of detecting a press-bonded ball at a bonding portion after bonding. For a pad in which two edges of a press-bonded ball corresponding to two adjacent sides of the pad are definite, the detecting apparatus detects the respective distances between the two sides of the pad and the corresponding two edges of the press-bonded ball, and compares the detected values to determine if these values fall within previously set allowable ranges; and if the detected values are outside the allowable ranges, the amount of offset is corrected so that the press-bonded ball comes within the allowable ranges.

16 Claims, 4 Drawing Sheets

APPARATUS FOR DETECTING PRESS-BONDED BALL AT BONDING PORTION IN BONDING APPARATUS AND METHOD FOR DETECTING PRESS-BONDED BALL AT BONDING PORTION

BACKGROUND OF THE INVENTION

The present invention relates to an apparatus for detecting a press-bonded ball at bonding portion in a bonding apparatus and a method for detecting a press-bonded ball at a bonding portion.

In a wire bonding method, a ball is formed at a tip end of a wire passing through a capillary, and the ball is bonded onto a first bonding point of a workpiece to form a press-bonded ball. Then, the wire is fed to bond the wire onto a second bonding point.

A wire bonding apparatus that performs such wire bonding includes a heat block capable of heating a lead frame, and a bonding arm that holds the capillary is positioned above the heat block. Further, the wire bonding apparatus is provided with various heat sources such as, in addition to the heat block, an ultrasonic wave oscillator, an X-axis motor and a Y-axis motor that drive an X-Y table, a Z-axis motor that moves the bonding arm either in a swinging manner or upward/downward.

Variations in ambient temperature and operating heat generation caused by these heat sources produce a difference between thermal expansion of the bonding arm and thermal expansion of a detection camera holding arm that holds a detection camera, and an offset (in both amount and direction) between a central axis of the detection camera and a central axis of the capillary changes. The difference due to the change then appears as displacement of a bonding position. Detection of the displacement of the bonding position is typically performed, using the detection camera, by detecting a central position of a press-bonded ball that has been bonded on a pad.

A conventional method for detecting a press-bonded ball that has been bonded to a pad is disclosed in Japanese Patent Application Unexamined Publication Disclosure No. 8-31863 (Japanese Patent No. 3235008), for example. This method includes detecting the edges of a press-bonded ball based on at least three directions that respectively connect the indication point that has previously been indicated and that is for indicating a wire-bonding portion when wire-bonding (center of the pad) and points on an outer circumference of the press-bonded ball, and calculating the central position of the press-bonded ball based on the at least three edges of the press-bonded ball. Then, positional displacement of the press-bonded ball is calculated based on the difference between the indication point and the central position of the press-bonded ball. FIG. 6 shows a specific example of a wire bonding apparatus 100 with a lead frame 101, a semiconductor chip 102, and a workpiece 103. In the wire-bonding method described above, generally, amounts of displacement of at least two fixed points on the semiconductor chip 102 and at least two fixed points on the lead frame 101 from their respective normal positions are detected using a camera 111. Then, based on the values of the detected amount, bonding coordinates that have been previously stored are corrected using a calculation unit. When the detection is carried out using the camera 111, an X-axis motor 112 and a Y-axis motor 113 are driven so that the central axis 111a of the camera 111 comes immediately above the detection point. After the coordinates are corrected in the above described manner, a capillary 115 is moved in the directions along the XY axis and the Z axis, and a wire passing through the capillary 115 is wire-bonded onto a pad of the semiconductor chip 102 and a lead of the lead frame 101.

In this case, the central axis 111a of the camera 111 is offset by a distance W from the central axis 115a of the capillary 115. Accordingly, after detecting the displacement of the fixed points using the camera 111 and correcting the bonding coordinates, the XY table 116 is moved by an offset amount W by the X-axis motor 112 and the Y-axis motor 113, and the capillary 115 is positioned above the first bonding point of the workpiece 103. Subsequently, the wire is wire-bonded at the corrected bonding coordinates, based on the movement of the XY table 116 in the direction along the XY axis by the X-axis motor 112 and the Y-axis motor 113, and the movement of the capillary 115 in the direction along the Z axis due to a capillary arm 117, which includes an ultrasonic horn and a bonding arm, moving either upward/downward or in a swinging manner by a Z-axis motor 114. The capillary arm 117 is swingably provided on the bonding head, and the camera 111 is fixed to the bonding head by a camera holding arm. It should be noted that Xw represents an X axis component in the offset amount W, and Yw represents a Y axis component in the offset amount W. As described above, the central axis 111a of the camera 111 and the central axis 115a of the capillary 115 are positioned with the offset amount W therebetween that has been mechanically determined. Therefore, it is possible to carry out the bonding accurately at the bonding position by, as described above, detecting the amount of displacement of the workpiece 103 by the camera 111 and correcting the bonding coordinates, and then sequentially moving the capillary 115, according to a predetermined program, by the offset amount W to the corrected bonding coordinates.

However, the wire bonding apparatus 100 includes a heat block capable of heating the lead frame 101, and the capillary arm 117 that holds the capillary 115 is positioned above the heat block. Further, the wire bonding apparatus 100 is further provided with various heat sources such as, in addition to the heat block, the X-axis motor 112 and the Y-axis motor 113 that drive the XY table 116 in the direction along the XY axis, an ultrasonic wave oscillator that is installed within the capillary arm 117, and the Z-axis motor 114 that moves the capillary arm 117 either in a swinging manner or upward/downward.

Variations in ambient temperature and operating heat generation caused by these heat sources produce a difference between the thermal expansion of the capillary arm 117 and the thermal expansion of the camera holding arm that holds the camera 111, and an offset (in both amount and direction) between the central axis 111a of the camera 111 and the central axis 115a of the capillary 115 changes. The difference due to the change appears as a displacement of the bonding position. In this method, the positional displacement of the press-bonded ball is considered as a variation in the amount of offset between the capillary and the detection camera, and the amount of offset is calibrated. Japanese Patent Application Unexamined Publication Disclosure No. 7-297220 (Japanese Patent No. 3101854) discloses an apparatus for detecting positional displacement of a press-bonded ball, which is an apparatus related to Japanese Patent Application Unexamined Publication Disclosure No. 8-31863.

However, the wire remains connected to the press-bonded ball. As a result, the edges of the outer circumference of the press-bonded ball are positioned behind the wire when the bonding portion is imaged from above using the detection camera; and this makes it difficult to determine the exact center of the press-bonded ball. Moreover, in recent years, the diameter of a press-bonded ball is closer to the diameter of a used wire, which increases the hidden area of the edge portion of the outer circumference of the press-bonded ball. As a result, the determination of the exact center of the press-bonded ball has increasingly become difficult.

SUMMARY OF THE INVENTION

An object of the present invention is to provide an apparatus for detecting a press-bonded ball at bonding portion in a bonding apparatus and a method for detecting a press-bonded ball at a bonding portion which are capable of correcting the amount of offset between a capillary and a detection camera so that a press-bonded ball can be formed in a predetermined area of a pad regardless of a portion of the press-bonded ball that comes behind a wire.

A first aspect of the present invention that solves the above problem is a method for detecting a press-bonded ball at a bonding portion after bonding in a bonding apparatus including a capillary capable of performing bonding onto a workpiece and a detection camera disposed with a certain amount of offset from the capillary, and this method comprises the steps of:
  selecting a pad having thereon a press-bonded ball whose edge corresponding to a side in an X direction of the pad is definite, as well as a pad having thereon a press-bonded ball whose edge corresponding to a side in a Y direction of the pad is definite;
  detecting distances between the two sides of the pad and the respective edges;
  comparing the detected values to determine whether or not the detected values respectively fall within predetermined allowable ranges; and
  correcting the amount of offset, if either of the detected values is outside an allowable range thereof, so that the press-bonded ball comes within the allowable range.

A second aspect of the present invention that solves the above problem is that in the first aspect of the present invention the two sides of the pad are two adjacent sides of a single pad.

A third aspect of the present invention that solves the above problem is that the first aspect of the present invention the two sides of the pad are sides of two different pads.

A fourth aspect of the present invention that solves the above problem is a method for detecting a press-bonded ball at a bonding portion after bonding in a bonding apparatus including a capillary capable of performing bonding onto a workpiece and a detection camera disposed with a certain amount of offset from the capillary, and the method comprises the steps of:
  selecting a first pad having thereon a press-bonded ball whose edges corresponding to two adjacent sides of the first pad are definite;
  detecting distances between the two sides of the first pad and the respective edges;
  comparing the detected values to determine whether or not the detected values respectively fall within predetermined allowable ranges;
  correcting the amount of offset, if either of the detected values is outside an allowable range thereof, so that the press-bonded ball comes within the allowable range;
  selecting a second pad having thereon a press-bonded ball whose edges corresponding to two adjacent sides of the second pad are definite, the two adjacent sides of the second pad being other than the sides corresponding to the two adjacent sides of the first pad;
  detecting distances between the two sides of the second pad and the respective edges; and
  calculating a diameter of the press-bonded ball and a positional displacement of the press-bonded ball according to the detected values for the first pad and the second pad.

A fifth aspect of the present invention that solves the above problem is a method for detecting a press-bonded ball at a bonding portion after bonding in a bonding apparatus including a capillary capable of performing bonding onto a workpiece and a detection camera disposed with a certain amount of offset from the capillary, and the method comprises the steps of:
  selecting a first pad having thereon a press-bonded ball whose edge corresponding to a side in an X direction of the first pad is definite, as well as a second pad having thereon a press-bonded ball whose edges corresponding to a side in a Y direction of the second pad is definite;
  detecting distances between the two sides of the first and second pads and the respective edges;
  comparing the detected values to determine whether or not the detected values respectively fall within predetermined allowable ranges;
  correcting the amount of offset, if either of the detected values is outside an allowable range thereof, so that the press-bonded ball comes within the allowable range;
  selecting a third pad having thereon a press-bonded ball whose edge corresponding to a side in an X direction of the third pad is definite, as well as a fourth pad having thereon a press-bonded ball whose edge corresponding to a side in a Y direction of the fourth pad is definite, the sides of the third and fourth pads being other than and correspond to the respective sides for the first and second pads;
  detecting distances between the two sides of the third and fourth pads and the respective edges of the press-bonded balls thereon; and
  calculating a diameter of the press-bonded ball and positional displacement of the press-bonded ball according to the detected values for the first and second pads, and the detected values for the third and fourth pads.

A sixth aspect of the present invention that solves the above problem is that in any one of the first through fifth aspects of the present invention the method is executed in a wire bonding apparatus.

A seventh aspect of the present invention that solves the above problem is that in any one of the first through fifth aspects of the present invention the method is executed in a bump bonding apparatus.

An eighth aspect of the present invention that solves the above problem is an apparatus for detecting a press-bonded ball by imaging a bonding portion after bonding used in a bonding apparatus provided with a capillary capable of performing bonding onto a workpiece and a detection camera disposed with a certain amount of offset from the capillary, the apparatus comprises:
  a pad width memory storing widths in an X direction and in a Y direction of a pad;
  an allowance memory storing allowable ranges for a distance between a side of the pad in the X direction and an edge of a press-bonded ball, and a distance between a side of the pad in the Y direction and an edge of the press-bonded ball;
  the detection camera described above and detects the distance between a side of a pad and an edge of a press-bonded ball in the X direction, as well as a distance between a side of a pad and an edge of a press-bonded ball in the Y direction, the edges of the press-bonded balls respectively in the X and Y directions being definite;

a comparison circuit capable of comparing the detected values from the detection camera and the allowable ranges stored in the allowance memory; and a calculation control unit capable of correcting the amount of offset stored in the offset memory, if the comparison by the comparison circuit determines that either of the detected values is outside its allowable range.

A ninth aspect of the present invention that solves the above problem is that in the eighth aspect of the present invention the two sides of the pad are two adjacent sides of a single pad.

A tenth aspect of the present invention that solves the above problem is that in the ninth aspect of the present invention the two sides of the pad are sides of two different pads.

An eleventh aspect of the present invention that solves the above problem is that in any one of the eighth through tenth aspects of the present invention the bonding apparatus is a wire bonding apparatus.

A twelfth aspect of the present invention that solves the above problem is that in any one of the eighth through tenth aspects of the present invention the bonding apparatus is a bump bonding apparatus.

The distances between a side and an edge of a pad in the X direction and between a side and an edge of a pad in the Y direction are detected, and the amount of offset is corrected by comparing the detected values to determine whether or not the values fall within the allowable ranges. Accordingly, it is possible to accurately correct the amount of offset.

According to the present invention, the distances between a side and an edge of a pad in the X direction and between a side and an edge of a pad in the Y direction are detected, and the detected values are compared to determine whether or not these values fall within the allowable ranges to correct the amount of offset. Thus, it is possible to accurately correct the amount of offset.

DETAILED DESCRIPTION OF THE INVENTION

In the following description, the present invention will be explained taking a wire bonding apparatus as an example. However, the present invention can also be applied to other bonding apparatus such as a bump bonding apparatus. The following describes one embodiment of a method for detecting a press-bonded ball at a wire-bonding portion and an apparatus for detecting a press-bonded ball according to the present invention, with reference to FIG. 1 and FIG. 2. FIG. 2 shows bonding portions in which pads 10A, 10B, 10C, and 10D are respectively bonded. Bonding to the bonding portions is performed in the following manner. A ball is formed at a tip end of a wire passing through a capillary, and the ball is bonded onto the pad 10A, which is a first bonding point, to form a press-bonded ball 20. Then, a wire 30 is fed to bond the wire 30 onto a second bonding point. Bonding is performed on the pads 10B, 10C, and 10D in the same manner.

Figure 1:
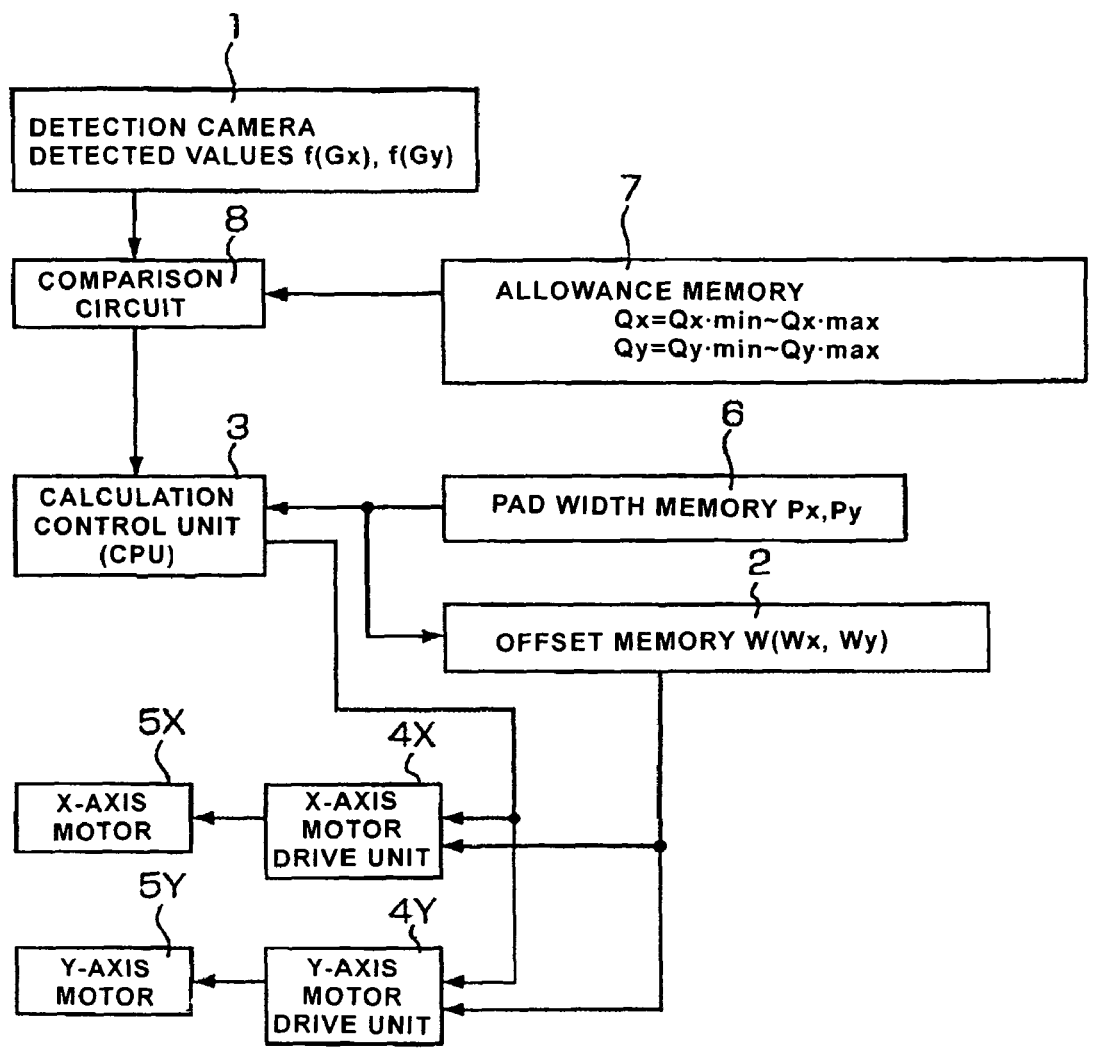
FIG. 1 is a block diagram showing one embodiment of an apparatus for detecting the press-bonded ball at a wire-bonding portion according to the present invention.

FIG. 1 shows only a main portion of a control circuit of this embodiment. A detection camera 1 is the same as a conventional detection camera and is offset by an offset amount W from the capillary. An X component Wx and a Y component Yx of the offset amount W are stored in an offset memory 2. When correcting the offset amount W, after bonding to the pads 10A, 10B, 10C, and 10D, a calculation control unit 3 controls an X-axis motor drive unit 4X and a Y-axis motor drive unit 4Y to be at coordinates obtained by adding the offset amount W to coordinates of any pad among the pads 10A, 10B, 10C, and 10D, for example, the pad 10A. As a result, an X-axis motor 5X and a Y-axis motor 5Y are driven, and the detection camera 1 moves to above the pad 10A that has been wire-bonded. Then, the pad 10A is imaged using the detection camera 1.

Figure 2A:
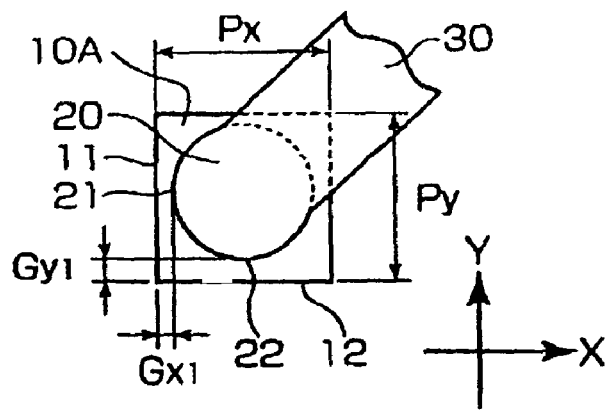
FIGS. 2(a) to 2(d) are illustrative diagrams showing one embodiment of a method for detecting the press-bonded ball at the wire-bonding portion according to the present invention.
Figure 2B:
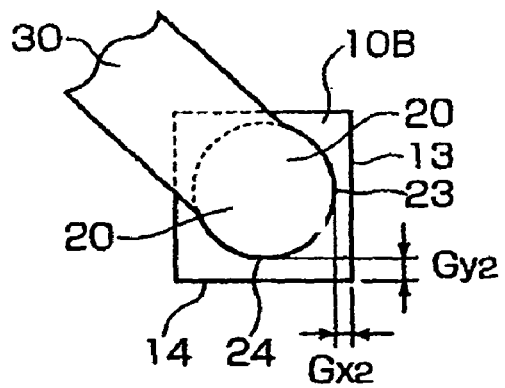
Figure 2C:
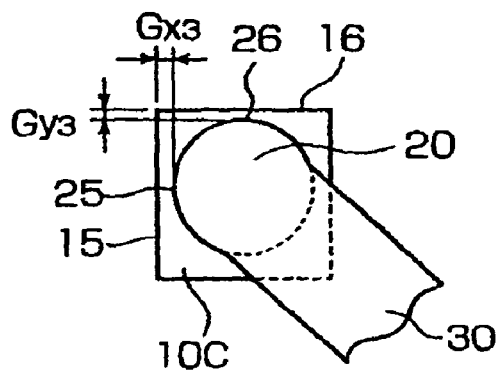
Figure 2D:
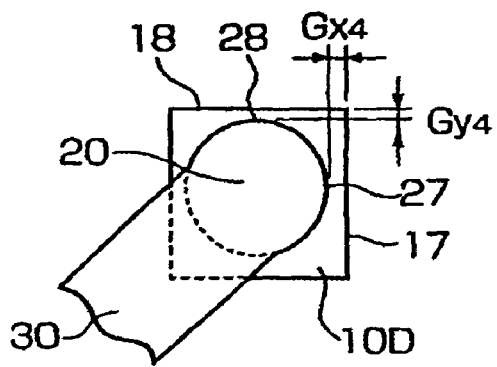

In this embodiment, the method for imaging the pads 10A, 10B, 10C, and 10D using the detection camera 1 is different from the conventional method. Referring to FIG. 2(a), edges 21 and 22 of the press-bonded ball 20 that correspond to two adjacent sides 11 and 12 of the pad 10A are definite. Therefore, when selecting the pad 10A, the detection camera 1 is configured so that it detects the distance f(Gx)=Gx1 between the side 11 of the pad 10A and the edge 21 of the press-bonded ball 20 in an X direction, and a distance f(Gy)=Gy1 between the side 12 of the pad 10A and the edge 22 of the press-bonded ball 20 in a Y direction. Similarly, in FIG. 2(b), the detection camera 1 detects the distances f(Gx)=Gx2 and f(Gy)=Gy2 respectively between edges 23 and 24 and two adjacent sides 13 and 14 that correspond to the edges 23 and 24. Likewise, in FIG. 2(c), the detection camera 1 detects the distances f(Gx)=Gx3 and f(Gy)=Gy3 respectively between edges 25 and 26 and two adjacent sides 15 and 16 that correspond to the edges 25 and 26, and in FIG. 2(d), the detection camera 1 detects the distances f(Gx)=Gx4 and f(Gy)=Gy4 respectively between edges 27 and 28 and two adjacent sides 17 and 18 that correspond to the edges 27 and 28.

The embodiment includes a pad width memory 6, an allowance memory 7, and a comparison circuit 8, as shown in FIG. 1, in addition to the configuration of the control circuit disclosed in Japanese Patent Application Unexamined Publication Disclosure No. 7-297220 (Japanese Patent No. 3101854). Further, the method for imaging the pads 10A, 10B, 10C, and 10D using the detection camera 1 is different from the conventional imaging method. Accordingly, the calculation control unit 3 also includes new functionalities different from the conventional example. The pad width memory 6 stores a width Px in the X direction and a width Py in the Y direction of each of the pads 10A, 10B, 10C, and 10D. The allowance memory 7 stores allowable ranges Qx and Qy for a range between the sides 11 to 18 of the pads 10A, 10B, 10C, and 10D and the edges 21 to 28 of the press-bonded ball 20 in the X direction and in the Y direction. When a minimum allowable range in the X direction is Qx·min and a maximum allowable range in the X direction is Qx·max, then the allowable range Qx is expressed by Equation 1. Further, when a minimum allowable range in the Y direction is Qy·min and a maximum allowable range in the Y direction is Qy·max, then the allowable range Qy is expressed by Equation 2. The comparison circuit 8 compares the detected values f(Gx) and f(Gy) obtained from the detection camera 1 with the allowable ranges Qx and Qy stored in the allowance memory 7. When the detected values f(Gx) and f(Gy) fall outside the allowable ranges, the comparison circuit 8 outputs a signal to notify the calculation control unit 3 of the result. The offset amount W (Wx, Wy) stored in the offset memory 2 is corrected according to this outputted signal so that the edges 21 to 28 of the press-bonded ball 20 is located approximately at the center of the allowable ranges.

$$Qx = Qx\text{·min} \sim Qx\text{·max} \qquad \text{Equation 1}$$

$$Qy = Qy\text{·min} \sim Qy\text{·max} \qquad \text{Equation 2}$$

Now, an operation will be described. After completing the wire-bonding onto a workpiece, the calculation control unit 3 reads, using an offset correction control memory that is not shown in the drawings, as in the conventional method, coordinates of the pad 10A stored in a bonding coordinates memory shown in FIG. 2(*a*) and the offset amount W stored in the offset memory 2. Then, the calculation control unit 3 controls the X-axis motor drive unit 4X and the Y-axis motor drive unit 4Y to be at coordinates obtained by adding the offset amount W to the coordinates of the pad 10A. This causes the X-axis motor 5X and the Y-axis motor 5Y to be driven, and the center of the detection camera 1 moves to above the pad 10A, and the pad 10A and the press-bonded ball 20 are imaged. The steps up to this point are the same as the conventional method.

In shown embodiment, the edges 21 and 22 of the press-bonded ball 20 that correspond to the sides 11 and 12 of the pad 10A are definite; accordingly, the detection camera detects the distance f(Gx)=Gx1 between the side 11 and the edge 21 and the distance f(Gy)=Gy1 between the side 12 and the edge 22. The comparison circuit 8 compares the detected values Gx1 and Gy1 supplied from the detection camera 1 with the allowable ranges Qx and Qy stored in the allowance memory 7; and when the detected values Gx1 and Gy1 fall within the allowable ranges Qx and Qy according to the Equations 1 and 2, the comparison circuit 8 outputs a signal indicating that the correction of the offset amount W is unnecessary. When the detected values Gx1 and Gy1 fall outside the allowable ranges Qx and Qy, the comparison circuit 8 outputs a signal to correct the offset amount W. The calculation control unit 3 corrects the detected values Gx1 and Gy1 so as to be at the centers of the allowable ranges Qx and Qy. The amount of displacement of the press-bonded ball 20, that is, the amounts of displacement Δx and Δy as an amount of offset are calculated according to Equation 3 and Equation 4. According to the amounts of displacement Δx and Δy as the amount of offset, the offset amount W stored in the offset memory 2 is corrected.

$$\Delta x = (Qx\text{·min} + Qx\text{·max})/2 - Gx_1 \qquad \text{Equation 3}$$

$$\Delta y = (Qy\text{·min} + Qy\text{·max})/2 - Gy_1 \qquad \text{Equation 4}$$

When the pad 10B shown in FIG. 2(*b*) is selected, Gx2 and Gy2 are detected. Gx3 and Gy3 are detected when the pad 10C shown in FIG. 2(*c*) is selected, and Gx4 and Gy4 are detected when the pad 10D shown in FIG. 2(*d*) is selected. Thus, when the detection is performed to any of the pads 10A, 10B, 10C, and 10D and if any amounts of displacement Δx and Δy are present, the offset amount W is corrected.

As described above, when the pad 10A is selected, the distances Gx1 and Gy1 are detected from the two adjacent sides 11 and 12 to the definite edges 21 and 22 corresponding to the two sides 11 and 12, the detected values are compared to determine whether or not the detected values fall within the allowable ranges Qx and Qy, and then the amount of offset is corrected. Thus, the amount of offset can be corrected accurately.

Figure 3A:
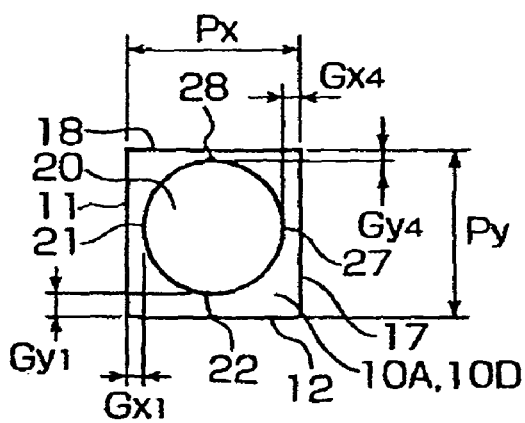
FIGS. 3(a) and 3(b) are illustrative diagrams showing one embodiment of a method for obtaining the diameter of a press-bonded ball and displacement at a center according to the resent invention.
Figure 3B:
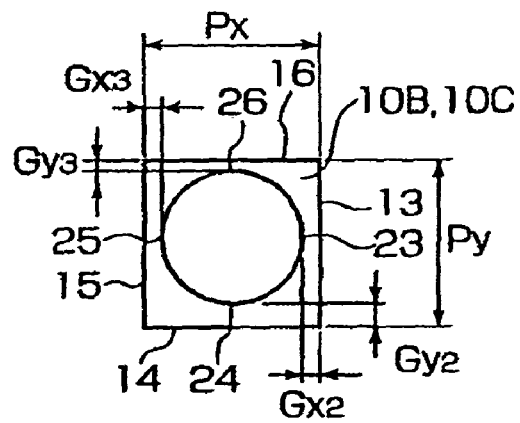

FIG. 4 shows a different embodiment of the method for detecting a press-bonded ball at a wire-bonding portion according to the present invention, illustrating one example of distances f(Gx) and f(Gy) that are detected for the pads 10A, 10B, 10C, and 10D in FIG. 3. In the previously described embodiment, the distances Gx1 and Gy1 respectively between the two adjacent sides 11 and 12 of any one of the pads, for example, the pad 10A, and the definite edges 21 and 22 corresponding to the two sides 11 and 12 are detected. However, the present invention is not limited to such a detection method as long as the distances from the sides to which the definite edges in the X direction and in the Y direction correspond are detected. In other words, different pads can be selected instead of using two adjacent sides of a single pad. For example, the pad 10A is selected for the X direction because the edge 21 is definite in the pad 10A shown in FIG. 4(*a*), and the pad 10B is selected for the Y direction because the edge 24 is definite in the pad 10B shown in FIG. 4(*b*). Then, the distance Gx1 between the side 11 of the pad 10A and the edge 21 is detected, and the distance Gy2 between the side 14 of the pad 10B and the edge 24 is detected. Subsequently, similarly to the previously described embodiment, the detected values Gx1 and Gy2 are compared to determine whether these detected values fall within the allowable ranges Qx and Qy, and the amount of offset is corrected accordingly. As seen from the above, the distances to be detected can be any one of Gx1, Gx2, Gx3 and Gx4, and any one of Gy1, Gy2, Gy3 and Gy4.

Although variations in diameter of the press-bonded ball 20 is small in the recent bonding technique, the diameter and center of a press-bonded ball 20 can be obtained in the following manner if necessary. When the pad 10A shown in FIG. 2(*a*) is selected, a pad whose edges of the press-bonded ball with respect to two other adjacent sides other than the two adjacent sides 11 and 12 are definite, that is, the pad 10D shown in FIG. 2(*d*), is selected to detect Gx1 and Gx4, and Gy1 and Gy4. As a result, as shown in FIG. 3(*a*), four distances Gx1, Gx4, Gy1, and Gy4 for the press-bonded ball 20 are detected. Therefore, the diameter D of the press-bonded ball 20 can be calculated by the calculation control unit 3 using Equation 5. Moreover, the amount and direction of the displacement of the press-bonded ball 20 can be easily obtained by comparing the difference of Gx1 and Gx4 and the difference of Gy1 and Gy4 by the calculation control unit 3.

$$D = [(Px+Py) - (Gx_1 + Gx_4 + Gy_1 + Gy_4)]/2 \qquad \text{Equation 5}$$

When the pad 10B shown in FIG. 2(*b*) is selected, this pad 10B and the pad 10C shown in FIG. 2(*c*) are selected and Gx2 and Gx3, and Gy2 and Gy3 are detected. As a result, as shown in FIG. 3(*b*), four distances Gx2, Gx3, Gy2, and Gy3 on the press-bonded ball 20 are detected, and the diameter D of the press-bonded ball 20 is calculated by the calculation control unit 3 using Equation 6. In addition, the amount and direction of the displacement of the press-bonded ball 20 is also easily obtained by comparing Gx2 with Gx3, and Gy2 with Gy3 by the calculation control unit 3.

$$D = [(Px+Py) - (Gx_2 + Gx_3 + Gy_2 + Gy_3)]/2 \qquad \text{Equation 6}$$

Figure 4A:
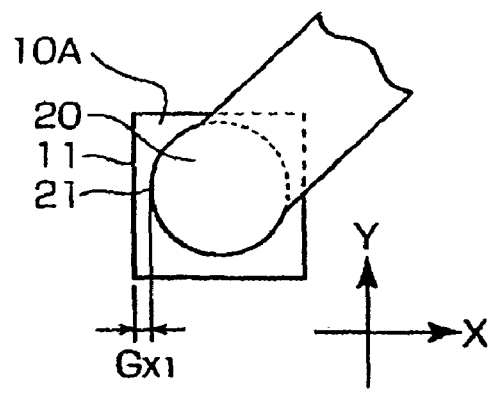
FIGS. 4(a) to 4(d) are illustrative diagrams showing a different embodiment of the method for detecting the press-bonded ball at a wire-bonding portion according to the present invention.
Figure 4B:
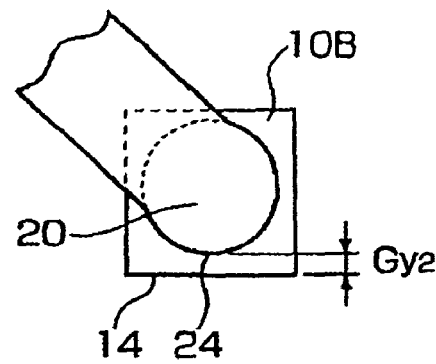
Figure 4C:
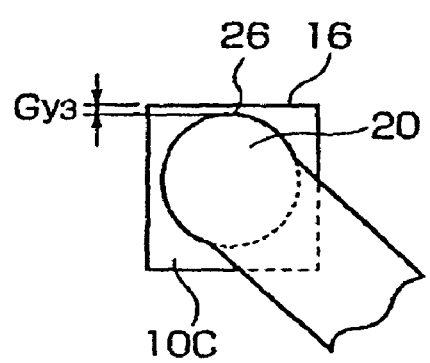
Figure 4D:
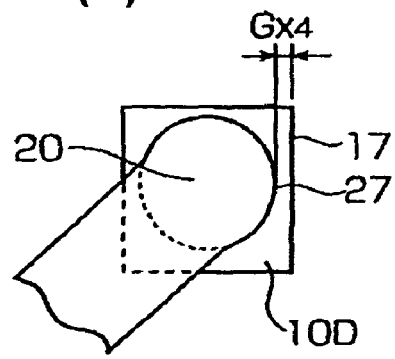
Figure 5:
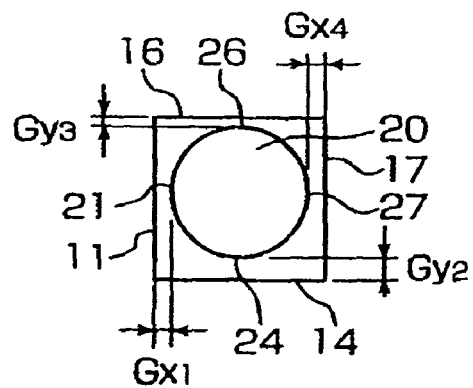
FIG. 5 is an illustrative diagram showing a different embodiment of the method for obtaining the diameter of a press-bonded ball and displacement at a center according to the present invention.
Figure 6:
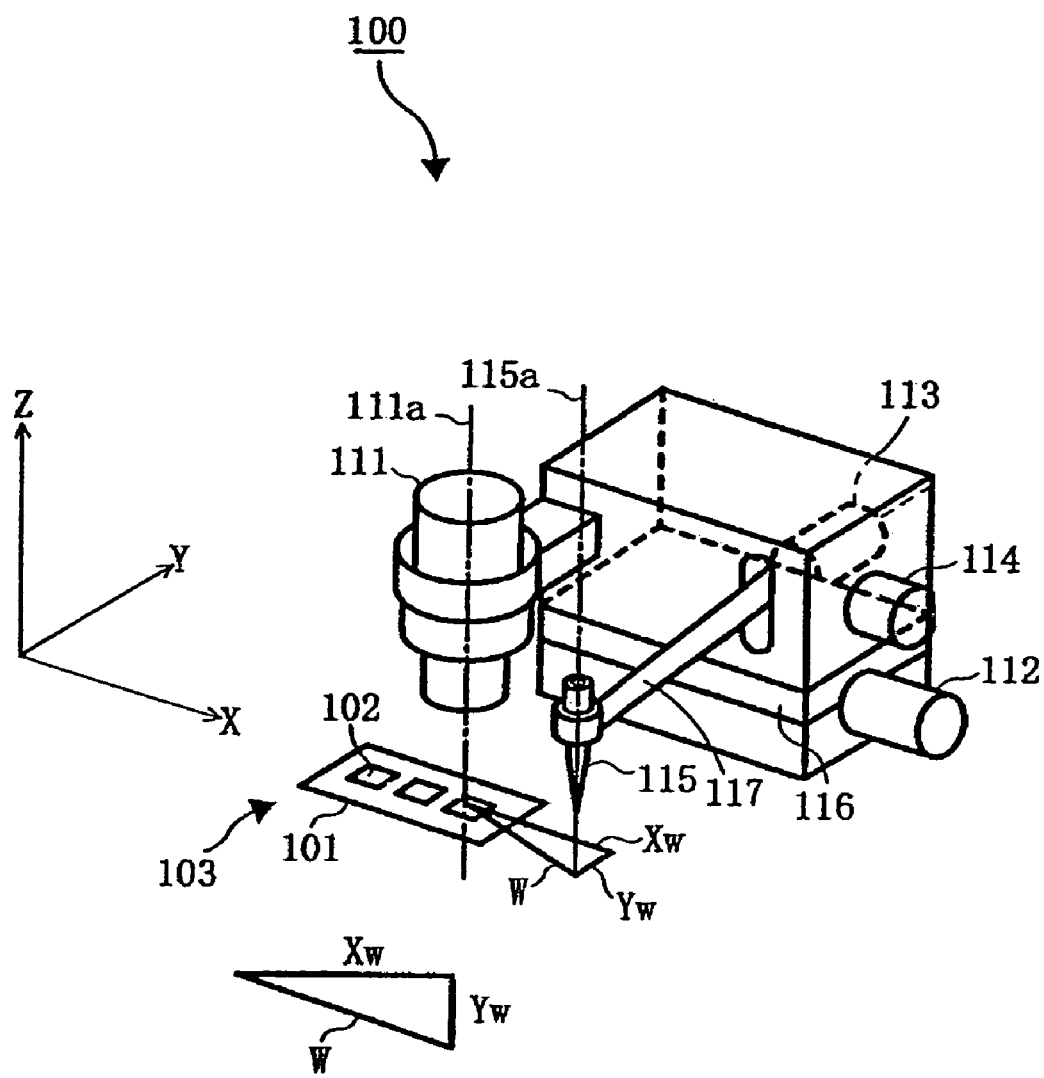
FIG. 6 is a perspective view showing a wire bonding apparatus illustrating the positional displacement of a press-bonded ball.

FIG. 4 and FIG. 5 show a different embodiment for obtaining the diameter and the center of the press-bonded ball 20. In the previously described embodiments, four edges corresponding to four sides of two pads, including a pad whose edges of the press-bonded ball corresponding to adjacent sides are definite and a pad whose edges of the press-bonded ball corresponding to other two adjacent sides are detected, are detected, thereby obtaining the diameter and the center of the press-bonded ball. Because it is necessary to detect distances from sides to which definite edges corresponding to four sides of a pad, four pads, for instance, can be selected.

In the embodiment of FIG. 4 and FIG. 5, for an X direction, for example, the distance Gx1 between the side 11 and the edge 21 on the pad 10A shown in FIG. 4(a) is detected, and the distance Gx4 between the side 17 and the edge 27 on the pad 10D shown in FIG. 4(d) is also detected. For a Y direction, for example, the distance Gy2 between the side 14 and the edge 24 on the pad 10B shown in FIG. 4(b) is detected, and the distance Gy3 between the side 16 and the edge 26 on the pad 10C shown in FIG. 4(c) is also detected. As a result, as shown in FIG. 5, the four distances Gx1, Gx4, Gy2, and Gy3 for the press-bonded ball 20 are detected. Therefore, the diameter D of the press-bonded ball 20 can be calculated by the calculation control unit 3 using Equation 7. Moreover, the amount and direction of the displacement of the press-bonded ball 20 can be easily obtained by comparing the difference of Gx1 and Gx4 and the difference of Gy2 and Gy3 by the calculation control unit 3.

$$D=[(Px+Py)-(Gx_1+Gx_4+Gy_2+Gy_3)]/2 \quad \text{Equation 7}$$

The invention claimed is:

1. A method of detecting a press-bonded ball at a bonding position after bonding operation in a bonding apparatus including a capillary capable of performing bonding onto a workpiece, a detection camera disposed with a certain amount of offset from the capillary and a calculation control unit for controlling bonding operation and detecting operation, the method comprising the steps of:
   selecting a pad having thereon a press-bonded ball whose edge corresponding to a side in an X direction of the pad is definite, as well as a pad having thereon a press-bonded ball whose edge corresponding to a side in a Y direction of the pad is definite, the respective corresponding edges being determined by the calculation control unit based upon an image of the pad that is captured by means of the detection camera;
   detecting distances between the two sides of the pad and the respective corresponding edges, the distances being determined by means of the calculation control unit based upon the image in the selected pad;
   comparing detected values based upon the distances to determine whether or not the detected values respectively fall within predetermined allowable ranges by means of the calculation control unit; and
   correcting the amount of offset for a next press-bonded ball by means of the calculation control unit, if either of the detected values is outside an allowable range thereof, so that the next press-bonded ball comes within the allowable range; and
   wherein the detection camera and the calculation control unit are implemented in the bonding apparatus that comprises instructions stored in a readable memory medium and the calculation control unit that executes the instructions.

2. The method according to claim 1, wherein the two sides of the pad are two adjacent sides of a single pad.

3. The method according to claim 1, wherein the two sides of the pad are sides of two different pads.

4. The method for according to claim 1, wherein said method is executed in a wire bonding apparatus.

5. The method according to claim 1, wherein said method is executed in a bump bonding apparatus.

6. A method of detecting a press-bonded ball at a bonding position, after bonding operation in a bonding apparatus including a capillary capable of performing bonding onto a workpiece, a detection camera disposed with a certain amount of offset from the capillary and a calculation control unit for controlling bonding operation and detecting operation, the method comprising the steps of:
   selecting a first pad having thereon a press-bonded ball whose edges corresponding to two adjacent sides of the first pad are definite, the respective corresponding edges being determined by the calculation control unit based upon an image of the first pad that is captured by means of the detection camera;
   detecting distances between the two sides of the first pad and the respective edges, the distances being determined by means of the calculation control unit based upon the image in the selected first pad;
   comparing detected values based upon the distances to determine whether or not the detected values respectively fall within predetermined allowable ranges by means of the calculation control unit;
   correcting the amount of offset for a next press-bonded ball by means of the calculation control unit, if either of the detected values is outside an allowable range thereof, so that the next press-bonded ball comes within the allowable range;
   selecting a second pad having thereon a press-bonded ball whose edges corresponding to two adjacent sides of the second pad are definite, the two adjacent sides of the second pad being other than the sides corresponding to the two adjacent sides of the first pad, the respective corresponding edges being determined by the calculation control unit based upon an image of the second pad that is captured by means of the detection camera;
   detecting distances between the two sides of the second pad and the respective edges, the distances being determined by means of the calculation control unit based on the image in the selected second pad; and
   calculating a diameter of the press-bonded ball and positional displacement of the press-bonded ball according to detected values based upon the distances for the first pad and the second pad; and
   wherein the detection camera and the calculation control unit are implemented in the bonding apparatus that comprises instructions stored in a readable memory medium and the calculation control unit that executes the instructions.

7. The method according to claim 6, wherein said method is executed in a wire bonding apparatus.

8. The method according to claim 6, wherein said method is executed in a bump bonding apparatus.

9. A method of detecting a press-bonded ball at a bonding position after bonding operation in a bonding apparatus including a capillary capable of performing bonding onto a workpiece, a detection camera disposed with a certain amount of offset from the capillary and a calculation control unit for controlling bonding operation and detecting operation, the method comprising the steps of:
   selecting a first pad having thereon a press-bonded ball whose edge corresponding to a side in an X direction of the first pad is definite, as well as a second pad having thereon a press-bonded ball whose edge corresponding to a side in a Y direction of the second pad is definite, the respective corresponding edges being determined by the calculation control unit based upon an image of the first pad that is captured by means of the detection camera;

detecting distances between the two sides of the first and second pads and the respective edges, the distances being determined by means of the calculation control unit based upon the image in the selected first and second pads;

comparing detected values based upon the distances to determine whether or not the detected values respectively fall within predetermined allowable ranges by means of the calculation control unit;

correcting the amount of offset for a next press-bonded ball by means of the calculation control unit, if either of the detected values is outside an allowable range thereof, so that the next press-bonded ball comes within the allowable range;

selecting a third pad having thereon a press-bonded ball whose edge corresponding to a side in an X direction of the third pad is definite, as well as a fourth pad having thereon a press-bonded ball whose edge corresponding to a side in a Y direction of the fourth pad is definite, the respective sides of the third and fourth pads being other than and correspond to the respective sides of the first and second pads, the respective corresponding edges being determined by the calculation control unit based upon an image of the third and fourth pad that is captured by means of the detection camera;

detecting distances between the two sides of the third and fourth pads and the respective edges of the press-bonded balls thereon, the distances being determined by means of the calculation control unit based upon the image in the third and fourth pads; and calculating a diameter of the press-bonded ball and a positional displacement of the press-bonded ball according to detected values based upon the distances for the first and second pads, and the detected values for the third and fourth pads; and wherein the detection camera and the calculation control unit are implemented in the bonding apparatus that comprises instructions stored in a readable memory medium and the calculation control unit that executes the instructions.

10. The method according to claim 9, wherein said method is executed in a wire bonding apparatus.

11. The method according to claim 9, wherein said method is executed in a bump bonding apparatus.

12. An apparatus for detecting a press-bonded ball by imaging a bonding position after bonding operation used in a bonding apparatus provided with a capillary capable of performing bonding onto a workpiece, a detection camera disposed with a certain amount of offset from the capillary and a calculation control unit for controlling bonding operation and detecting operation, the apparatus comprising:

a capillary capable of performing bonding onto a workpiece;

a pad width memory storing widths in an X direction and in a Y direction of a pad;

an allowance memory storing allowable ranges for a distance between a side of the pad in an X direction and an edge of a press-bonded ball, and a distance between a side of the pad in a Y direction and an edge of the press-bonded ball;

a detection camera disposed with a certain amount of offset from the capillary, the detection camera detecting a distance between a side of a pad and an edge of a press-bonded ball in the X direction, as well as a distance between a side of a pad and an edge of a press-bonded ball in the Y direction, the edges of the press-bonded balls respectively in the X and Y directions being definite;

a comparison circuit capable of comparing the detected values from the detection camera and the allowable ranges stored in the allowance memory; and a calculation control unit capable of correcting the amount of offset stored in an offset memory, if the comparison by the comparison circuit determines that either of the detected values is outside allowable range thereof.

13. The apparatus according to claim 12, wherein the two sides of the pad are two adjacent sides of a single pad.

14. The apparatus according to claim 12, wherein the two sides of the pad are sides of two different pads.

15. The apparatus according to claim 12, wherein said bonding apparatus is a wire bonding apparatus.

16. The apparatus according to claim 12, wherein said bonding apparatus is a bump bonding apparatus.

* * * * *